US012270835B2

(12) United States Patent
Lee (10) Patent No.: US 12,270,835 B2
(45) Date of Patent: Apr. 8, 2025

(54) CONTACTOR MANAGEMENT METHOD AND BATTERY SYSTEM PROVIDING THE SAME METHOD THEREOF (71) Applicant: LG ENERGY SOLUTION, LTD., Seoul (KR)

(72) Inventor: Hojoon Lee, Daejeon (KR)

(73) Assignee: LG ENERGY SOLUTION, LTD., Seoul (KR)

(*) Notice: Subject to any disclaimer, the term of this patent is extended or adjusted under 35 U.S.C. 154(b) by 103 days.

(21) Appl. No.: 17/790,809

(22) PCT Filed: Aug. 4, 2021

(86) PCT No.: PCT/KR2021/010222
§ 371 (c)(1),
(2) Date: Jul. 5, 2022

(87) PCT Pub. No.: WO2022/045620
PCT Pub. Date: Mar. 3, 2022

(65) Prior Publication Data
US 2023/0021766 A1 Jan. 26, 2023

(30) Foreign Application Priority Data
Aug. 24, 2020 (KR) .......................... 10-2020-0106280

(51) Int. Cl.
*G01R 19/10* (2006.01)
*G01R 19/25* (2006.01)
(Continued)

(52) U.S. Cl.
CPC ............. *G01R 19/10* (2013.01); *G01R 19/25* (2013.01); *H01M 10/425* (2013.01);
(Continued)

(58) Field of Classification Search
CPC .... G01R 19/10; G01R 19/25; G01R 31/3277; G01R 31/392; G01R 19/1659;
(Continued)

(56) References Cited

U.S. PATENT DOCUMENTS 9,733,292 B2    8/2017  Delbaere et al.
10,101,394 B2  10/2018  Salziger et al.
(Continued)

FOREIGN PATENT DOCUMENTS

JP     5-11277 U      2/1993
JP     2008-224558 A  9/2008
(Continued)

OTHER PUBLICATIONS

International Search Report for PCT/KR2021/010222 (PCT/ISA/210) mailed on Nov. 11, 2021.

*Primary Examiner* — Daniel R Miller
(74) *Attorney, Agent, or Firm* — Birch, Stewart, Kolasch & Birch, LLP (57) ABSTRACT

Discussed is a contactor management method and a battery system to perform the method, wherein the battery system includes a contactor connected between a battery pack and an external device; a voltage measurer to measure a first operation voltage supplied to the contactor; and a controller to determine opening or closing of the contactor based on the first operation voltage measured from the voltage measurer, wherein the controller determines the contactor as open in an opened state when the first operation voltage is not supplied to the contactor, determines the contactor as closed in a closed state when the first operation voltage is supplied to the contactor, and counts each openings and closings of the contactor and determines a replacement time of the contactor based on a sum value of the counts exceeding a predetermined reference value.

18 Claims, 4 Drawing Sheets

(51) Int. Cl.
  *H01M 10/42* (2006.01)
  *H01M 10/48* (2006.01)
  *H02J 7/00* (2006.01)
(52) U.S. Cl.
  CPC ......... *H01M 10/482* (2013.01); *H02J 7/0069* (2020.01); *H01M 2010/4271* (2013.01); *H01M 2220/20* (2013.01)
(58) Field of Classification Search
  CPC .. G01R 31/327; G01R 31/364; G01R 31/371; G01R 31/3835; G01R 31/52; H01M 10/425; H01M 10/482; H01M 2010/4271; H01M 2220/20; H01M 10/48; H02J 7/0069; H02J 7/007182; H02J 7/0031; H02J 7/0063; H02J 7/0068; H02J 7/007; H01H 2071/044; H01H 47/002; Y02T 10/70
  See application file for complete search history.

(56) References Cited

U.S. PATENT DOCUMENTS

| | | | | |
|---|---|---|---|---|
| 2002/0167223 | A1* | 11/2002 | Yamazaki | B60L 58/10 307/9.1 |
| 2011/0241692 | A1* | 10/2011 | Akita | H01H 3/001 324/423 |
| 2014/0002092 | A1 | 1/2014 | Kodama et al. | |
| 2014/0125290 | A1 | 5/2014 | Kim et al. | |
| 2015/0061376 | A1* | 3/2015 | Hartl | B60L 3/0007 307/116 |
| 2018/0164363 | A1 | 6/2018 | Brorein et al. | |
| 2020/0003838 | A1* | 1/2020 | Robertson | G01R 31/3277 |
| 2020/0033410 | A1 | 1/2020 | Yoon | |
| 2020/0057107 | A1 | 2/2020 | Cho et al. | |
| 2020/0091734 | A1 | 3/2020 | Odegaard et al. | |
| 2021/0234383 | A1 | 7/2021 | Lee et al. | |

FOREIGN PATENT DOCUMENTS

| | | |
|---|---|---|
| JP | 2012-199114 A | 10/2012 |
| JP | 2014-23236 A | 2/2014 |
| JP | 2014-525221 A | 9/2014 |
| JP | 2019-50697 A | 3/2019 |
| KR | 10-2008-0071100 A | 8/2008 |
| KR | 10-1314114 B1 | 10/2013 |
| KR | 10-1687869 B1 | 12/2016 |
| KR | 10-2017-0142013 A | 12/2017 |
| KR | 10-2018-0067384 A | 6/2018 |
| KR | 10-2018-0135614 A | 12/2018 |
| KR | 10-2019-0037658 A | 4/2019 |
| KR | 10-2020-0053376 A | 5/2020 |
| WO | WO 2017/158375 A1 | 9/2017 |

* cited by examiner

CONTACTOR MANAGEMENT METHOD AND BATTERY SYSTEM PROVIDING THE SAME METHOD THEREOF

CROSS-REFERENCE TO RELATED APPLICATION

This application claims priority to and the benefit of Korean Patent Application No. 10-2020-0106280 filed in the Korean Intellectual Property Office on Aug. 24, 2020, the entire contents of which are incorporated herein by reference.

BACKGROUND OF THE INVENTION (a) Field of the Invention

Technical Field

Embodiments of the present invention relate to a method for managing a contactor by determining replacement timing of a contactor that electrically connects or disconnects a battery and an external device, and a battery system that provides the same method.

Background Art

Recently, as a part of environmental protection, research and an interest in electric vehicles such as an HEV (Hybrid Electric Vehicle) or an EV (Electric Vehicle) are increasing. The electric vehicle includes a rechargeable battery (hereinafter, a battery) that may be repeatedly charged and discharged, a BMS (BATTERY MANAGEMENT SYSTEM) that manages the charging/discharging of the battery, and a contactor for electrically connecting or disconnecting the battery and an external device (a load or an external charger) for charging/discharging the battery. Here, the contactor is a switching element that closes other circuits by being driven when an input voltage reaches an operation voltage (e.g., 12 V).

Meanwhile, a degree of fatigue is accumulated in the contactor due to a cutoff current or an inrush current generated during the opening or closing operation of the contactor. When the contactor ages and the fatigue accumulates, the contactor may be welded in a closed state or an open state. The contactor that is in the welded state may not operate according to a control signal. Then, the load may be greatly damaged by a high current discharged from the high voltage battery.

Therefore, the contactor needs to be replaced before the welded occurrence is expected, and a replacement cost increases if the replacement time is too early. Also, if the replacement time is too late, there is a problem that the contactor is welded.

DISCLOSURE

Technical Problem

The present invention is to provide a contactor management method for determining the opening or closing of the contactor based on the operation voltage supplied to the contactor and a battery system providing the method.

The present invention is to provide a contactor management method that counts each of the openings and closings of the contactor, and determines the replacement time of the contactor based on the sum of the counted results, and a battery system that provides the method.

Technical Solution

A battery system of the present invention includes: a contactor connected between a battery pack and an external device; a voltage measuring unit measuring a first operation voltage supplied to the contactor; and a control unit determining an opening or closing of the contactor based on the first operation voltage measured from the voltage measuring unit, wherein the control unit determines the contactor as the opening if the first operation voltage is not supplied to the contactor, determines the contactor as the closing if the first operation voltage is supplied to the contactor, and counts each of the openings and closings of the contactor to be determined as a replacement time of the contactor if the sum value of the counted result exceeds a predetermined reference value.

The control unit may control the first operation voltage to not be supplied to the contactor to maintain the opening of the contactor if the sum value exceeds the reference value.

A driving unit receiving a first driving signal controlling the supply of the first operation voltage from the control unit and supplying the first operation voltage to the contactor according to the received first driving signal may be further included.

The contactor may include a contact unit including: a first fixed contact unit and a second fixed contact unit respectively connected to a first point and a second point separated from each other on a power line connecting the battery pack and the external device, and a moving contact unit disposed to be spaced by a predetermined interval in a position facing the first fixed contact unit and the second fixed contact unit; a coil unit that performs an electromagnet function when the operation voltage is supplied; and a plunger unit for releasing or contacting the moving contact unit from or to the first fixed contact unit and the second fixed contact unit by reciprocating in a straight line by the electromagnetic force of the coil unit.

The contactor may be a main contactor electrically connecting or disconnecting the battery pack and the external device.

The battery system may further include a pre-charge contactor connected to the main contactor, the voltage measuring unit may measure a second operation voltage supplied to the pre-charge contactor to be transmitted to the control unit, and the control unit may determine the pre-charge contactor as the opening if the second operation voltage is not supplied to the pre-charge contactor, determines the pre-charge contactor as the closing if the second operation voltage is supplied to the pre-charge contactor, and counts each of the openings and closings of the pre-charge contactor to be determined as a replacement time of the pre-charge contactor if a sum value of the counted result exceeds the reference value.

The driving unit may receive a second driving signal controlling the supply of the second operation voltage to the pre-charge contactor from the control unit and supply of the second operation voltage to the pre-charge contactor according to the second driving signal.

The voltage measuring unit may be an analog-to-digital converter (ADC) converting the measured first operation voltage into a digital signal to be transmitted to the control unit.

A contactor management method of the present invention includes: receiving a measured value of an operation voltage supplied to a contactor from a voltage measuring unit; determining opening or closing of the contactor based on the operation voltage measured from the voltage measuring unit and counting each of the openings and closings of the contactor; and determining a replacement time of the contactor if a sum value of the counted result exceeds a predetermined reference value, and in each counting of the openings and closings of the contactor, if the operation voltage is not supplied to the contactor, the contactor is determined as the opening, and if the operation voltage is supplied to the contactor, the contactor is determined as the closing.

In the determining of the replacement time of the contactor, if the sum value of the counted result exceeds the predetermined reference value, the operation voltage may be controlled to not be supplied to the contactor so that the opening of the contactor may be maintained.

Advantageous Effects

Since the present invention determines the opening or closing of the physical contactor based on the operation voltage, it is possible to calculate the actual fatigue accumulated in the contactor with high reliability.

The present invention, by replacing the contactor at an optimal time based on the actual accumulated fatigue, reduces the occurrence of additional costs due to the early replacement, and has the effect of preventing the occurrence of the welding.

The present invention counts each of the openings and closings of the contactor, and determines the replacement time of the contactor based on the sum value of the counted result, so the replacement time may be easily predicted.

MODE FOR INVENTION

Hereinafter, embodiments disclosed in the present specification will be described in detail with reference to the accompanying drawings. In the present specification, the same or similar components will be denoted by the same or similar reference numerals, and an overlapped description thereof will be omitted. The terms "module" and "unit" for components used in the following description are used only in order to easily make a specification. Therefore, these terms do not have meanings or roles that distinguish them from each other in themselves. Further, in describing embodiments of the present specification, when it is determined that a detailed description of the well-known art associated with the present invention may obscure the gist of the present invention, it will be omitted. In addition, the accompanying drawings are provided only in order to allow embodiments disclosed in the present specification to be easily understood and are not to be interpreted as limiting the spirit disclosed in the present specification, and it is to be understood that the present invention includes all modifications, equivalents, and substitutions without departing from the scope and spirit of the present invention.

Terms including ordinal numbers such as first, second, and the like will be used only to describe various components, and are not to be interpreted as limiting these components. The terms are only used to differentiate one component from other components.

It is to be understood that when one component is referred to as being "connected" or "coupled" to another component, it may be connected or coupled directly to another component or be connected or coupled to another component with the other component intervening therebetween. On the other hand, it is to be understood that when one component is referred to as being "connected or coupled directly" to another component, it may be connected to or coupled to another component without another component intervening therebetween.

It will be further understood that terms "comprise" or "have" used in the present specification specify the presence of stated features, numerals, steps, operations, components, parts, or a combination thereof, but do not preclude the presence or addition of one or more other features, numerals, steps, operations, components, parts, or a combination thereof.

Figure 1:
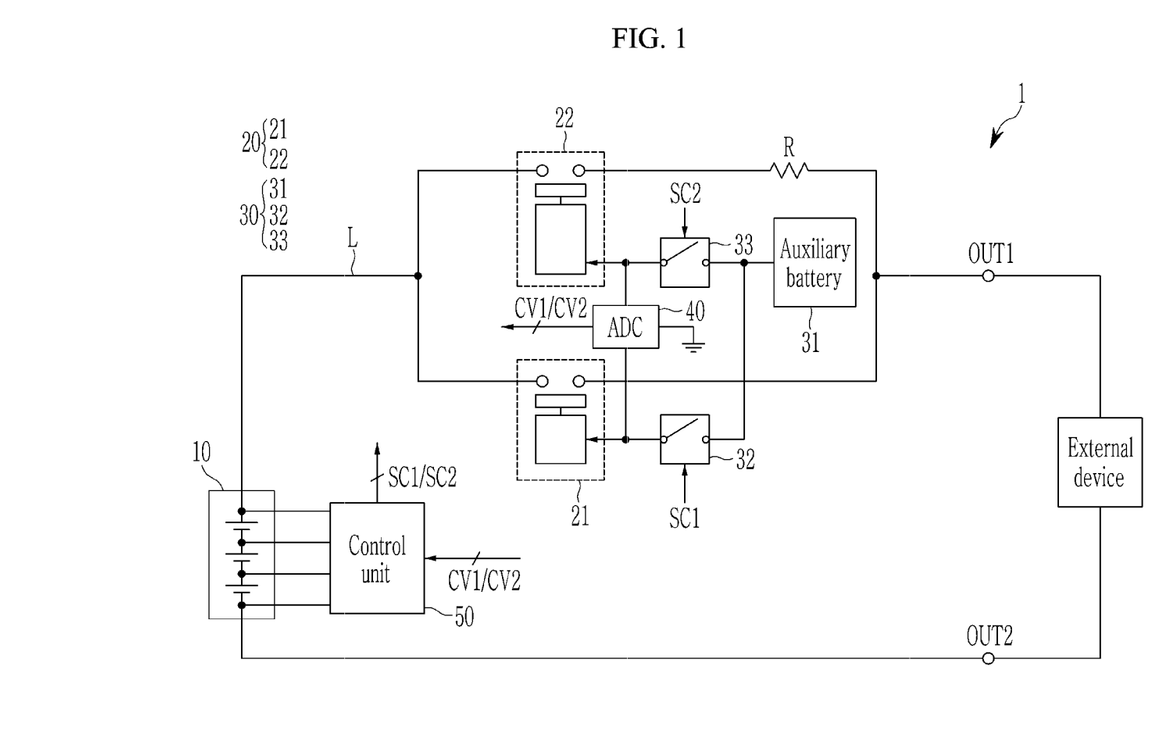
FIG. 1 is a view explaining a battery system according to an exemplary embodiment.

FIG. 1 is a view explaining a battery system according to an exemplary embodiment.

Referring to FIG. 1, a battery system 1 includes a battery pack 10, a contactor 20, a driving unit 30, a voltage measuring unit (Analog-Digital Converter; ADC) 40, and a control unit 50.

The battery pack 10 includes a plurality of battery cells electrically connected to each other. In some exemplary embodiments, the battery cell may be a rechargeable battery that is rechargeable. A predetermined number of battery cells are connected in series to form a battery module, and a predetermined number of battery modules are connected in series and in parallel to form a battery pack 10, thereby supplying desired power. Each of a plurality of battery cell is electrically connected to the control unit 50, for example, by a battery management system (BMS) through wiring.

In FIG. 1, the battery pack 10 includes a plurality of battery cells connected in series, and connected between two output terminals OUT1 and OUT2 of the battery system 1. A contactor 20 is connected between the positive pole of the battery pack 10 and the output terminal OUT1. The components shown in FIG. 1 and the connection relationships between the components are an example of the invention, but it is not limited thereto.

The contactor 20 may include a main contactor 21 connected between the positive electrode of the battery pack 10 and the first output terminal OUT1. In addition, the contactor 20 may include a pre-charge contactor 22 connected to the pre-charge resistor R in series between the positive electrode of the battery pack 10 and the first output terminal OUT1.

The main contactor 21 may be closed according to the first driving signal SC1 of an enable level, and may be opened according to the first driving signal SC1 of a disable level. When the main contactor 21 is closed, the battery system 1 and an external device are electrically connected to each other to perform the charge or discharge. For example, when the external device is a load, the discharge operation in which a power is supplied from the battery pack 10 to the load is performed, and when the external device is a charger, the battery pack 10 may be charged by the charger. When the main contactor 21 is opened, the battery system 1 and the external device are electrically disconnected.

The pre-charge contactor 22 may be connected in series with the pre-charge resistor R, closed according to the second driving signal SC2 of the enable level, and opened according to the second driving signal SC2 of the disable level.

For example, when the main contactor 21 is closed, the power is supplied from the high voltage battery pack 10 to the inverter, and the motor (the load) is driven. Before the high voltage battery pack 10 and the capacitor of the inverter are connected by the main contactor 21, the pre-charge contactor 22 allows the capacitor of the inverter to be pre-charged. Then, a surge current generated when the main contactor 21 and the load are connected is reduced. According to the exemplary embodiment, the pre-charge contactor 22 is first closed before the main contactor 21 is closed, and when a predetermined time elapses while the main contactor 21 is closed, the pre-charge contactor 22 may be opened again to reduce the surge current.

The contactor 20 is not clearly distinguished from a relay, and it is sometimes used interchangeably. In some cases, it may be called a contactor 20 when opening and closing a circuit of high power (e.g., 5 KW or more), and a relay when opening and closing a circuit of high power or less (e.g., less than 5 KW). The contactor 20 may be interlocked with an independent circuit, and has a merit that a circuit of large current may be electrically connected or disconnected due to the operation of a circuit composed of a low voltage system such as 5 V. Also, since a coil part and a contact part in the contactor 20 are insulated and separated, there is a merit that it may be electrically insulated from external devices. Hereinafter, the contactor 20 according to the exemplary embodiment may include a relay.

The driving unit 30 may include an auxiliary battery 31, a first switch 32, and a second switch 33.

The auxiliary battery 31 may supply power to the main contactor 21 and the pre-charge contactor 22. The auxiliary battery 31 may supply an operation voltage of 12 V to each of the main contactor 21 and the pre-charge contactor 22. For example, the auxiliary battery 31 may be a rechargeable battery that is rechargeable. The auxiliary battery 31 may include a DC/DC converter for charging the auxiliary battery 31 by lowering the high voltage power discharged from the battery pack 10 to an operation voltage level. As another example, the auxiliary battery 31 may be a primary battery capable of supplying an operation voltage to each of the main contactor 21 and the pre-charge contactor 22.

The first switch 32 is connected between the main contactor 21 and the auxiliary battery 31, and may be switched according to the first driving signal SC1 of the enable level. The first switch 32 controls the electrical connection between the main contactor 21 and the auxiliary battery 31. When the first switch 32 is turned on, the main contactor 21 and the auxiliary battery 31 are electrically connected to each other, and the power is supplied from the auxiliary battery 31 to the main contactor 21. In this case, the voltage of the supplied power may be a first operation voltage that closes the main contactor 21.

The second switch 33 is connected between the pre-charge contactor 22 and the auxiliary battery 31, and may be switched according to the second driving signal SC2 of the enable level. The second switch 33 controls the electrical connection between the pre-charge contactor 22 and the auxiliary battery 31. When the second switch 33 is turned on, the pre-charge contactor 22 and the auxiliary battery 31 are electrically connected to each other, and the power is supplied from the auxiliary battery 31 to the pre-charge contactor 22. In this case, the voltage of the supplied power may be a second operation voltage that closes the pre-charge contactor 22.

When the main contactor 21 and the pre-charge contactor 22 are the same type of contactor, the first operation voltage and the second operation voltage may be the same level of voltage. According to the exemplary embodiment, the first operation voltage and the second operation voltage may be a voltage level corresponding to 12 V, but is not limited thereto, and various voltage levels may be set as the operation voltage.

The voltage measuring unit (ADC) 40 measures the first and second operation voltages supplied to each of the main contactor 21 and the pre-charge contactor 22, and may convert the measured first and second operation voltages to first and second digital signals CV1/CV2. Specifically, the voltage measuring unit (ADC) 40 converts an analog value of the first and second operation voltages supplied to each of the main contactor 21 and the pre-charge contactor 22 into the first and second digital signals CV1/CV2 to be transmitted to the control unit 50.

For example, when the first operation voltage of 12 V is supplied to the main contactor 21, the voltage measuring unit (ADC) 40 may transmit the first digital signal CV1 indicating the voltage level of 12 V to the control unit 50. If the first operation voltage is not supplied to the main contactor 21, the voltage measuring unit (ADC) 40 may transmit the first digital signal CV1 indicating the voltage level of 0 V to the control unit 50.

For example, when the second operation voltage of 12 V is supplied to the pre-charge contactor 22, the voltage measuring unit (ADC) 40 may transmit the second digital signal CV2 indicating the voltage level of 12 V to the control unit 50. If the second operation voltage is not supplied to the pre-charge contactor 22, the voltage measuring unit (ADC) 40 may transmit the second digital signal CV2 indicating the voltage level of 0 V to the control unit 50.

The control unit 50 may transmit the first driving signal SC1 and the second driving signal SC2 for controlling the switching of the main contactor 21 and the pre-charge contactor 22, respectively, to the driving unit 30. According to the exemplary embodiment, the control unit 50 may be configured as a battery management system (BMS).

The control unit 50 may determine whether each of the main contactor 21 and the pre-charge contactor 22 is opened or closed based on the operation voltage measured by the voltage measuring unit (ADC) 40. According to the exemplary embodiment, the control unit 50 may determine the opening or the closing of each of the main contactor 21 and the pre-charge contactor 22 based on the first digital signal CV1 and the second digital signal CV2 received from the voltage measuring unit (ADC) 40.

When the control unit 50 transmits the driving signal (SC) of the enable level to the driving unit 30, the driving unit 30 supplies the operation voltage to the contactor 20. Then, the contactor 20 performs a closing operation. However, in the state that the driving signal SC is at the enable level, the case that the operation voltage supplied to the contactor 20 may be temporarily stopped and then supplied again may be generated due to various circumstances around it. At this time, the contactor 20 is physically opened and then again performs the closing operation. However, since the driving signal SC maintains the enable level, this situation may not be detected when the control unit 50 counts the opening or closing of the main contactor 21 based on the driving signal. The driving signal SC may be at least one of the first driving signal SC1 and the second driving signal SC2.

According to an exemplary embodiment, the control unit 50, based on the operation voltage applied to the contactor 20, counts each of the openings or the closings of the contactor 20, and if the sum value of the counted result exceeds a predetermined reference value, the replacement time of the contactor 20 may be determined. Then, the optimal replacement time may be predicted based on the actual fatigue accumulated in the contactor 20 when being opened or closed. At this time, the reference value may be calculated based on the sum value of the number of the opening and closing times in which the welded phenomenon occurs by the experiment, and may be different depending on the type of the contactor 20.

Figure 2:
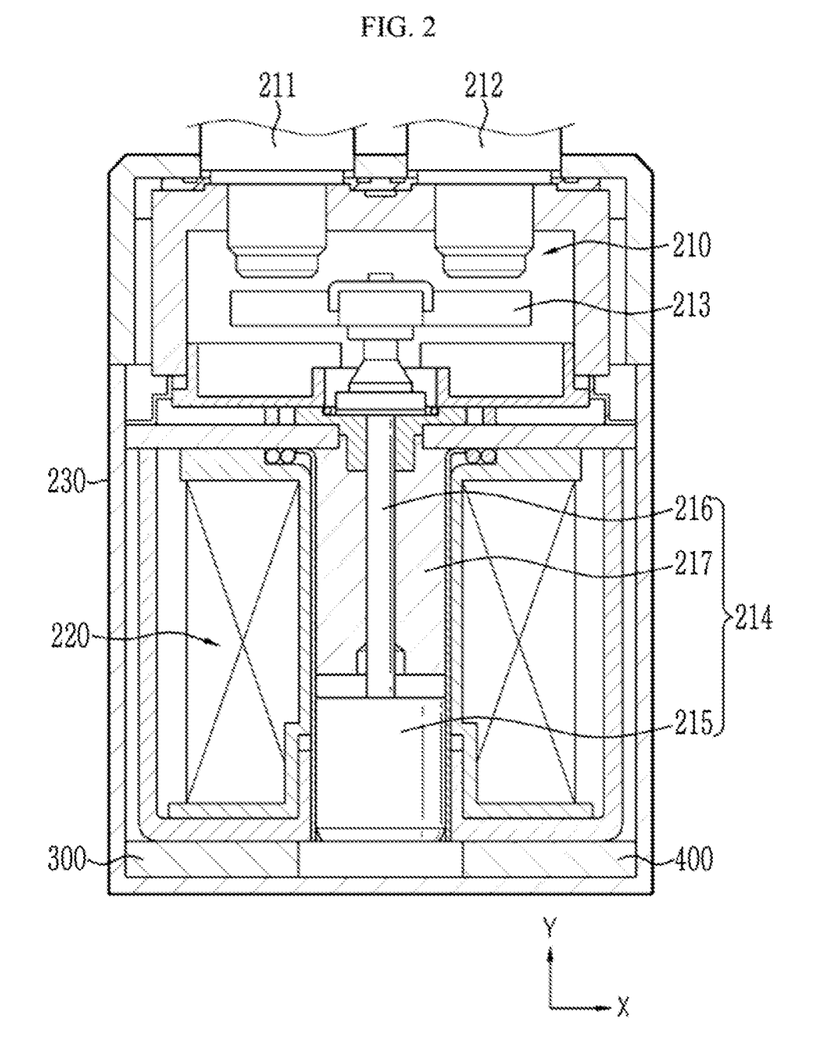
FIG. 2 and FIG. 3 are views explaining before and after driving of a contactor according to an exemplary embodiment.
Figure 3:
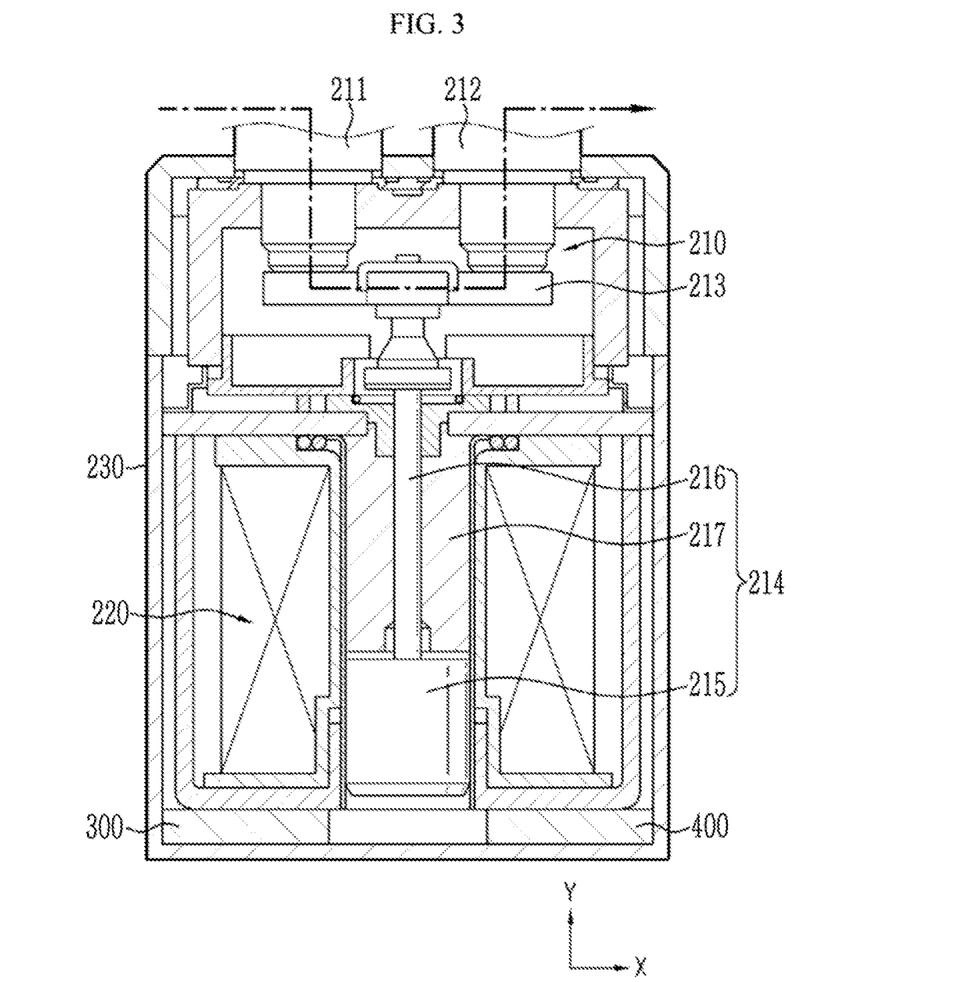

FIG. 2 and FIG. 3 are views explaining before and after driving of a contactor according to an exemplary embodiment.

Referring to FIG. 1 and FIG. 2, the contactor 20 may control the flow of the current between the battery pack 10 and the external device by connecting or disconnecting the disconnected first and second points on the power line L.

When the control unit 50 transmits the first driving signal SC1 of the enable level to the driving unit 30, the first switch 32 is turned on. Then, the power discharged from the auxiliary battery 31 may be supplied to the main contactor 21. At this time, the level of the power supplied to the main contactor 21 may belong to a range (e.g., 9 V to 16 V) of a rated operation voltage that allows the main contactor 21 to operate normally. The voltage measuring unit (ADC) 40 may measure the operation voltage supplied to the main contactor 21 and transmit the information indicating the level of the measured operation voltage to the control unit 50. The range of the rated operation voltage may vary depending on the type of main contactor 21.

When the control unit 50 transmits the first driving signal SC1 of the disable level to the driving unit 30, the first switch 32 is turned off. Then, the power discharged from the auxiliary battery 31 is not supplied to the main contactor 21. The voltage measuring unit (ADC) 40 may transmit the information indicating the level of the ground voltage to the control unit 50.

Referring to FIG. 2 and FIG. 3, for example, the contactor 20 may be configured as a plunger type including a contact unit 210, a coil unit 220, a plunger unit 214, and a housing 230. However, the contactor 20 is not limited to the plunger type, as an electronic switch such as a hinge type of electromagnetic relay, and may include a switch of a type that is operated as a type pulling an iron piece, and opening or closing a contact point attached to the iron piece when a current flows through the coil and becomes an electromagnet.

The contact unit 210 may include a first fixed contact unit 211, a second fixed contact unit 212, and a moving contact unit 213. The first fixed contact unit 211 and the second fixed contact unit 212 are respectively connected to the first and second points that are disconnected from each other on the power line L, and the moving contact unit 213 is positioned facing the first and second fixed contact units 211 and 212 to be spaced apart by a predetermined interval. The moving contact unit 213 may be configured as a metal plate. The moving contact unit 213 is contacted with or separated from the first and second fixed contact units 211 and 212, so that the flow of the large current on the power line L may be controlled. The contact or contact release between the moving contact unit 213 and the first and second fixed contact units 211 and 212 depends on a reciprocating motion in a straight line of the plunger unit 214.

For example, when the switching operation of the contactor 20 is repeated, a degree of fatigue is accumulated, and the contactor 20 is aged due to the accumulation of fatigue and may be welded in the closed state or the opened state. If it falls into the fusion state, the contactor 20 does not operate according to the driving signal SC. Specifically, referring to FIG. 2 and FIG. 3, the moving contact unit 213 may be fused to at least one of the first and second fixed contact units 211 and 212.

The coil unit 220 causes the plunger unit 214 to reciprocate on the straight line by a solenoid action. The coil unit 220 is formed in a cylindrical, i.e., a hollow shape by winding the coil long, and the plunger unit 214 is disposed to the central passage provided inside the coil unit 220.

The contactor 20 may have a different rated operation voltage according to the specifications of the coil unit 220. For example, the contactor 20 may perform the closing operation when the operation voltage (e.g., 12 V) of a predetermined level is supplied, and may perform the opening operation when the operation voltage is not supplied. The electric vehicle is equipped with an auxiliary battery 31 of a 12 V voltage in addition to the high voltage battery pack 10, and may be used as a power source for supplying the operation voltage to the contactor 20. The auxiliary battery 31 may be used as a power source for starting the engine or as a power source for various electronic devices such as vehicle headlights.

The plunger unit 214 may move out of the central passage of the coil unit 220 by the solenoid action of the coil unit 220 when the current flows to the coil unit 220. At this time, the moving contact unit 213 and the first and second fixed contact units 211 and 212 are in contact. And when the current to the coil unit 220 is cut off, the plunger unit 214 returns to the original position thereof, and the moving contact unit 213 and the first and second fixed contact units 211 and 212 may be released from the contact.

The plunger unit 214 may include a moving core 215, a plunger shaft 216, and a fixed core 217.

The moving core 215 is a metal block and is provided to be movable by the electromagnetic force of the coil unit 220 in an unconstrained state in the central passage. The plunger shaft 216 may extend from the moving core 215 in the length direction of the central passage, and the end thereof engages with the moving contact unit 213 outside the central passage. The moving core 215 and the plunger shaft 216 move together when the current is applied to the coil unit 220.

The fixed core 217 serves to limit the travel distance of the moving core 215 and the plunger shaft 216. The fixed core 217 is fixed in the central passage of the coil unit 220, and has an interior diameter that allows the plunger shaft 216 to pass through but not the moving core 215 because of the hollow shape thereof.

Referring to FIG. 2 and FIG. 3, when electric power is applied to the coil unit 220, the moving core 215 may move in the +Y-axis direction to a position where the moving core 215 abuts against the fixed core 217 by the electromagnetic force of the coil unit 220. In this case, the moving distance of the moving core 215 corresponds to a distance between the moving contact unit 213 and the first and second fixed contact units 211 and 212. Supports 300 and 400 may respectively support a coil unit 220.

Figure 4:
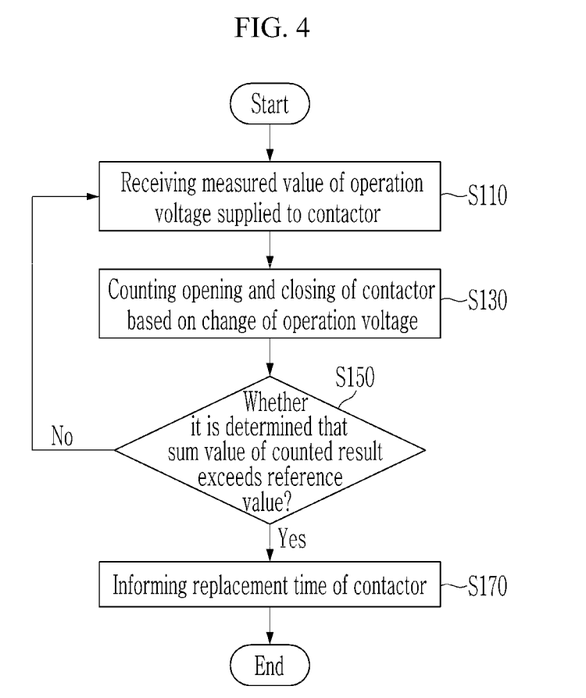
FIG. 4 is a flowchart explaining a contactor management method according to an exemplary embodiment.

FIG. 4 is a flowchart explaining a contactor management method according to an exemplary embodiment.

Hereinafter the contactor management method and the battery system that provides the method are described with reference to FIG. 1 to FIG. 4.

Referring to FIG. 4, first, the control unit 50 receives the measured value of the operation voltage supplied to the contactor 20 connected between the battery pack 10 and the external device from the voltage measuring unit (ADC) 40 (S110).

The contactor 20 may be a mechanical contactor that is closed when the operation voltage is supplied and is opened when the operation voltage is not supplied. According to an exemplary embodiment, the contactor 20 may be a main contactor 21 connected between the battery pack 10 and an external device or a pre-charge contactor 22 connected to the main contactor 21.

The voltage measuring unit (ADC) 40 may measure the operation voltage supplied to the contactor 20 and transmit the measured operation voltage to the control unit 50. For example, the voltage measuring unit (ADC) 40 measures the first and second operation voltages supplied to each of the main contactor 21 and the pre-charge contactor 22, and converts the measured first and second operation voltages into the first and second digital signal (CV1/CV2) to be transmitted to the control unit 50.

Next, the control unit 50 determines the physically opening or closing of the contactor 20 based on the change in the operation voltage measured by the voltage measuring unit (ADC) 40, and counts each of the openings and closings (S130).

When the control unit 50 transmits the driving signal SC of the enable level to the driving unit 30, the driving unit 30 supplies the operation voltage to the contactor 20. Then, the contactor 20 performs the closing operation. However, in the state that the driving signal SC is the enable level, the case that the operation voltage supplied to the contactor 20 may be temporarily stopped and then supplied again due to various circumstances therearound. At this time, the contactor 20 is operated to be physically opened and then closed again. However, since the driving signal SC maintains the enable level, this situation may not be detected when the control unit 50 counts the openings or closings of the contactor 20 based on the driving signal.

According to an exemplary embodiment, the control unit 50 may determine the physically opening or closing of the contactor 20 based on the change in the operation voltage for driving the contactor 20, thereby predicting the fatigue level actually accumulated in the contactor 20.

Next, the control unit 50 determines whether the sum value of the counted result exceeds a predetermined reference value (S150).

When the operation voltage is supplied to the contactor 20, the control unit 50 determines that it is closed and counts it once. If the operation voltage is not supplied to the contactor 20, the control unit 50 determines to be opened and counts it once. The control unit 50 sums the counted results of each opening or closing, and determines whether the sum value exceeds a predetermined reference value. At this time, the reference value may be calculated based on the sum value of the number of opening and closing times in which the welded phenomenon occurs by an experiment, and may be different depending on the type of the contactor 20.

Next, when the sum value exceeds the predetermined reference value (S150, Yes), the control unit 50 determines it as the replacement time of the contactor 20 (S170).

The control unit 50 may transmit a message for the replacement of the contactor 20, for example, a notification message including at least one of information on an arrival of the replacement time and information on the count sum value to an external terminal through an upper control unit, for example, an electronic control unit (ECU). The manager may then replace the contactor 20 at an appropriate time before the welding occurs.

According to an exemplary embodiment, if the sum value exceeds a predetermined reference value, the control unit 50 may transmit the control signal SC of the disable level to the driving unit 30 so that the operation voltage is not supplied to the contactor 20. Then, the contactor 20 may be prevented from being welded before the replacement.

While this invention has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

The invention claimed is:

1. A battery system comprising:
    a contactor connected between a battery pack and an external device;
    an auxiliary battery configured to supply a first operation voltage;
    a voltage measurer;
    a controller; and
    a driver having an input coupled to the auxiliary battery and an output coupled to the contactor, the driver to supply the first operation voltage to the contactor according to first driving signal received by the driver from the controller,
    wherein the voltage measurer is coupled to the output of the driver to measure voltage supplied to the contactor by the driver;
    wherein the controller is coupled to the voltage measurer to receive voltage measurements from the voltage measurer;
    wherein the controller determines the contactor as open in an opened state when the voltage measurements indicate that the first operation voltage is not supplied to the contactor, determines the contactor as closed in a closed state when the voltage measurements indicate that the first operation voltage is supplied to the contactor, and counts each openings and closings of the contactor based on whether or not the first operation voltage is supplied and determines a replacement time of the contactor based on a sum value of the counts exceeding a predetermined reference value.

2. The battery system of claim 1, wherein the controller controls the first operation voltage to not be supplied to the contactor to maintain the opening of the contactor when the sum value exceeds the predetermined reference value.

3. The battery system of claim 1, wherein the contactor includes:
    a contact unit including a first fixed contact unit and a second fixed contact unit respectively connected to a first point and a second point separated from each other on a power line connecting the battery pack and the external device, and a moving contact unit disposed to be spaced by a predetermined interval at a position facing the first fixed contact unit and the second fixed contact unit;
    a coil unit that performs an electromagnet function when the first operation voltage is supplied; and
    a plunger unit to release or contact the moving contact unit to the first fixed contact unit and the second fixed contact unit by reciprocating in a straight line by an electromagnetic force of the coil unit.

4. The battery system of claim 1, wherein the contactor is a main contactor to electrically connect or disconnect the battery pack and the external device.

5. The battery system of claim 4, further comprising a pre-charge contactor connected to the main contractor, wherein the voltage measurer measures a second operation voltage supplied to the pre-charge contactor to be transmitted to the controller, and wherein the controller determines the pre-charge contactor as open in the opened state when the second operation voltage is not supplied to the pre-charge contactor, determines the pre-charge contactor as closed in the closed state when the second operation voltage is supplied to the pre-charge contactor, and counts each openings and closings of the pre-charge contactor to determine the replacement time of the pre-charge contactor when a sum value of the counts exceeds the predetermined reference value.

6. The battery system of claim 5, wherein a driver receives a second driving signal controlling a supply of the second operation voltage to the pre-charge contactor from the controller and supplies the second operation voltage to the pre-charge contactor according to the second driving signal.

7. The battery system of claim 1, wherein the voltage measurer is an analog-to-digital converter (ADC) converting the measured first operation voltage into a digital signal to be transmitted to the controller.

8. The battery system of claim 1, wherein the controller transmits a message for the replacement of the contactor when the sum value of the counts exceeds the predetermined reference value.

9. The battery system of claim 1, wherein the controller determines a physical opening or a physical closing of the contactor based on a change in the first operation voltage.

10. The battery system of claim 1, further comprising a switch connected between the contactor and the auxiliary battery, and configured to be switched according to a driving signal, and
wherein, when the switch is turned on, the contactor and the auxiliary battery are electrically connected to each other, and the first operation voltage is supplied from the auxiliary battery to the contactor.

11. The battery system of claim 1, wherein the voltage measurer is configured to transmit a first digital signal indicating a first predetermined voltage level to the controller when the first operation voltage is supplied to the contactor, and is configured to transmit the first digital signal indicating a second predetermined voltage level to the controller when the first operation voltage is not supplied to the contactor.

12. The battery system of claim 11, wherein the voltage measurer is further configured to transmit a second digital signal indicating the first predetermined voltage level to the controller when a second operation voltage is supplied to a pre-charge contactor, and is configured to transmit the second digital signal indicating the second predetermined voltage level to the controller when the second operation voltage is not supplied to the pre-charge contactor.

13. The battery system of claim 1,
wherein the contactor is a main contactor to electrically connect or disconnect the battery pack and the external device,
wherein the battery system further comprises a pre-charge contactor to electrically connect or disconnect the battery pack and the external device, and
wherein the driver includes:
a first switch connected between the main contactor and the auxiliary battery to supply the first operation voltage to the main contactor; and
a second switch connected between the pre-charge contactor and the auxiliary battery to supply the first operation voltage to the pre-charge contactor.

14. A contactor management method for determining a replacement time of a contactor connected between a battery pack and an external device, the method comprising:
receiving, by a driver, a driving signal controlling a supply of an operation voltage, wherein the driving signal is received from a controller;
supplying, by the driver, the operation voltage to the contactor from an auxiliary battery according to the received driving signal, the driver having an input coupled to the auxiliary battery and an output coupled to the contactor;
receiving, by the controller, a measurement of voltage supplied by the driver to the contactor, wherein the voltage measurement is received from a voltage measurer coupled to the output of the driver;
determining, by the controller, an opening or closing of the contactor based on the voltage measurement from the voltage measurer and counting each openings and closings of the contactor based on whether or not the voltage measurement indicates that the operation voltage is supplied to the contactor by the driver;
determining, by the controller, the replacement time of the contactor when a sum value of the counting exceeds a predetermined reference value; and
transmitting a notification message for replacement of the contactor based on the determining,
wherein, in counting each openings and closings of the contactor,
when the operation voltage is not supplied to the contactor, the contactor is determined by the controller as open in an open state, and when the operation voltage is supplied to the contactor, the contactor is determined by the controller as closed in a closed state.

15. The contactor management method of claim 14, wherein in the determining for the replacement time of the contactor,
when the sum value of the counting exceeds the predetermined reference value, the operation voltage is controlled by the controller to not be supplied to the contactor so that the open state of the contactor is maintained.

16. The contactor management method of claim 14, wherein a physical opening or a physical closing of the contactor is determined based on a change in the operation voltage.

17. The contactor management method of claim 14, wherein the controller transmits a message for a replacement of the contactor when the sum value of the counts exceeds the predetermined reference value.

18. The contactor management method of claim 14, wherein a switch is connected between the contactor and the auxiliary battery, and the switch is configured to be switched according to a driving signal, and
wherein, when the switch is turned on, the contactor and the auxiliary battery are electrically connected to each other, and the operation voltage is supplied from the auxiliary battery to the contactor.

* * * * *